United States Patent
Krishnamurthi et al.

(10) Patent No.: US 11,658,647 B2
(45) Date of Patent: May 23, 2023

(54) ADJUSTABLE DELAY LINE DEVICES AND METHODS THEREOF

(71) Applicant: Intrinsix Corp., Marlborough, MA (US)

(72) Inventors: Kathiravan Krishnamurthi, Westford, MA (US); Finbarr McGrath, Chelmsford, MA (US)

(73) Assignee: INTRINSIX CORP., Marlborough, MA (US)

( * ) Notice: Subject to any disclaimer, the term of this patent is extended or adjusted under 35 U.S.C. 154(b) by 0 days.

(21) Appl. No.: 17/405,009

(22) Filed: Aug. 17, 2021

(65) Prior Publication Data

US 2022/0131535 A1 Apr. 28, 2022

Related U.S. Application Data

(60) Provisional application No. 63/067,672, filed on Aug. 19, 2020.

(51) Int. Cl.
*H03K 5/00* (2006.01)
*H03K 5/133* (2014.01)
*H03K 5/145* (2006.01)

(52) U.S. Cl.
CPC ............ *H03K 5/133* (2013.01); *H03K 5/145* (2013.01); *H03K 2005/00026* (2013.01)

(58) Field of Classification Search
CPC ............ H03K 5/133; H03K 5/145; H03K 2005/00026; H03H 7/0115; H03H 7/38
See application file for complete search history.

(56) References Cited

U.S. PATENT DOCUMENTS

| | | | |
|---|---|---|---|
| 8,811,911 B2* | 8/2014 | Su | H04B 1/0458 455/193.1 |
| 9,948,265 B2* | 4/2018 | Wang | H03H 7/0115 |
| 10,608,613 B1* | 3/2020 | DiMarzio | H03H 7/52 |
| 2013/0207730 A1* | 8/2013 | Lee | H01L 29/93 330/296 |
| 2014/0120849 A1* | 5/2014 | Peltonen | H04B 17/13 455/77 |
| 2014/0285299 A1* | 9/2014 | Bojer | H03H 5/003 336/105 |
| 2015/0097637 A1* | 4/2015 | Pye | H03H 7/0115 333/174 |
| 2017/0026021 A1* | 1/2017 | Cheng | H03H 7/0115 |
| 2017/0331445 A1* | 11/2017 | Ma | H04B 1/0458 |
| 2020/0373897 A1* | 11/2020 | Wang | H03H 7/18 |

FOREIGN PATENT DOCUMENTS

WO  WO 2022/015758 A1 *  1/2022

* cited by examiner

*Primary Examiner* — Tuan T Lam
(74) *Attorney, Agent, or Firm* — Troutman Pepper Hamilton Sanders LLP (Rochester)

(57) ABSTRACT

A switched delay section for an integrated circuit device is disclosed. The switched delay section includes a segmented inductor loop comprising a plurality of segments separated by nodes. A plurality of capacitors are coupled between the segmented inductor loop to provide a plurality of delay sections. An image loop is in electrical communication with the segmented inductor loop. The image loop includes a switch configured to place the plurality of capacitors in one of a high capacitance or a low capacitance state to provide a variable delay value.

29 Claims, 13 Drawing Sheets

Prior Art

Prior Art

FIG. 2A

Primary Loop (L1)

Prior Art

Mutual Coupling (M)

Image Loop (L2)

Varactor Bias (V)

FIG. 11

ADJUSTABLE DELAY LINE DEVICES AND METHODS THEREOF

This application claims the benefit of U.S. Provisional Patent Application Ser. No. 63/067,672, filed Aug. 19, 2020.

FIELD

The present technology relates to systems and methods to implement time delay and/or phase shift in integrated circuit devices. More particularly, the present technology relates to adjustable microwave and millimeter wave artificial delay lines. Specifically, the present technology relates to compact, tunable, single ended or differential tunable delay sections and systems thereof.

BACKGROUND

Precise wideband programmable time delays are frequently used, for example, in 5G and radar system time delay circuits to control beam steering. The simplest implementation of a pure time delay circuit is a transmission line of appropriate length where the time delay ($t_d$) and the characteristic impedance ($Z_o$) are defined by the inductance (L') and capacitance (C') per unit length. The formulas for $t_d$ and $Z_o$ are shown in equations (1) and (2) below as functions of the inductance (L) and the capacitance (C).

$$t_d = \sqrt{LC} \quad (1)$$

$$Z_o = \sqrt{L/C} \quad (2)$$

In general, these systems require maximum delays of one or two periods of the frequency of interest. This means that pure transmission line implementations of delays are not practical for integrated circuits operating below 20 GHz. Even at millimeter wave frequencies, transmission lines take up considerable layout space in integrated circuit devices, which is undesirable. Further, the delay of a transmission line is defined by its length and its phase velocity and is inherently difficult to adjust.

Numerous examples of switchable delay lines are based on altering the phase velocity ($V_p$) by adjusting C' and inductance L' for a given length of line based on equation (3) as set forth below.

$$V_P = \frac{1}{\sqrt{L'C'}} \quad (3)$$

This is achieved by switching in more capacitance and inductance in a given segment to increase delay, or by reducing L' and C' to reduce delay. Longer switchable delays are achieved by cascading sections of line and enforcing the requirement that $Z_o$ is held constant for all the sections in their high or low delay configurations, where $Z_o$ is given by equation (4) as set forth below.

$$Z_0 = \sqrt{\frac{L'}{C'}} \ (ohms) \quad (4)$$

Figure 1A:
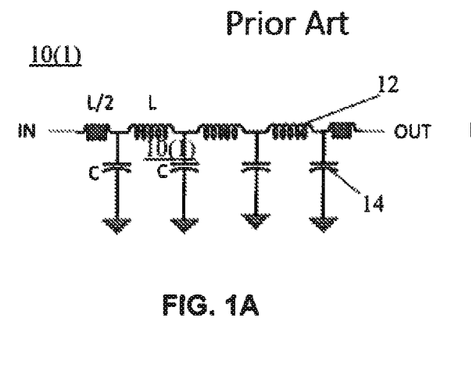
FIGS. 1A-1C are circuit diagrams of exemplary prior art artificial delay lines.
Figure 1B:
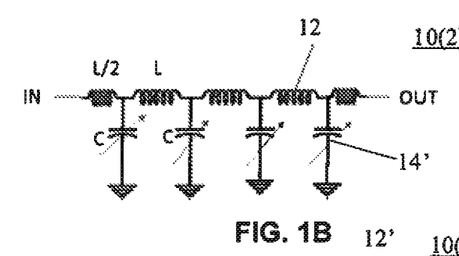
Figure 1C:
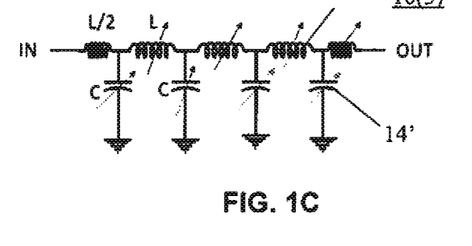

An alternative approach to implementing pure delays is to use "artificial" transmission lines made from a finite number of series inductors and shunt capacitors that approximate real transmission lines as shown in the prior art examples of FIGS. 1A-1C. FIG. 1A shows an example of an artificial delay line 10(1) including inductors 12 located in series with shunt capacitors 14 located between each of the inductors 12. The inductors 12 can be realized routinely in spiral forms on chip with metal-insulator-metal capacitors 14. This approach approximates an ideal delay ($t_d$) with controlled characteristic impedance ($Z_0$) up to frequencies less than the Bragg frequency, is given by $$\left(\frac{1}{\pi\sqrt{LC}}\right).$$

At frequencies approaching the Bragg frequency, the unit LC element of an artificial line becomes a low pass structure and the signal gets severely attenuated. In practice, artificial transmission lines are limited to operation well below the Bragg frequency and made up of multiple sections (N) whose bandwidth (BW) is determined by the total delay required and the required rise time of the circuit. This has traditionally limited the use of spiral inductors and artificial transmission lines at millimeter wave frequencies for large delays or phase shifts.

FIG. 1B shows an artificial delay line 10(2) that employs variable capacitors 14' to tune the unit delay ($\sqrt{LC}$), while keeping a fixed inductance (L) value using inductors 12. However, this violates the requirement for constant characteristic impedance ($Z_0$) as shown in equation 4. FIG. 1C shows an artificial delay line 10(3) with both variable capacitors 14' and inductors 12'. This allows for adjustment of both the unit capacitor value (C) and the unit inductor value (L) so that $Z_0$ stays constant in the high or low delay state.

Figure 2A:
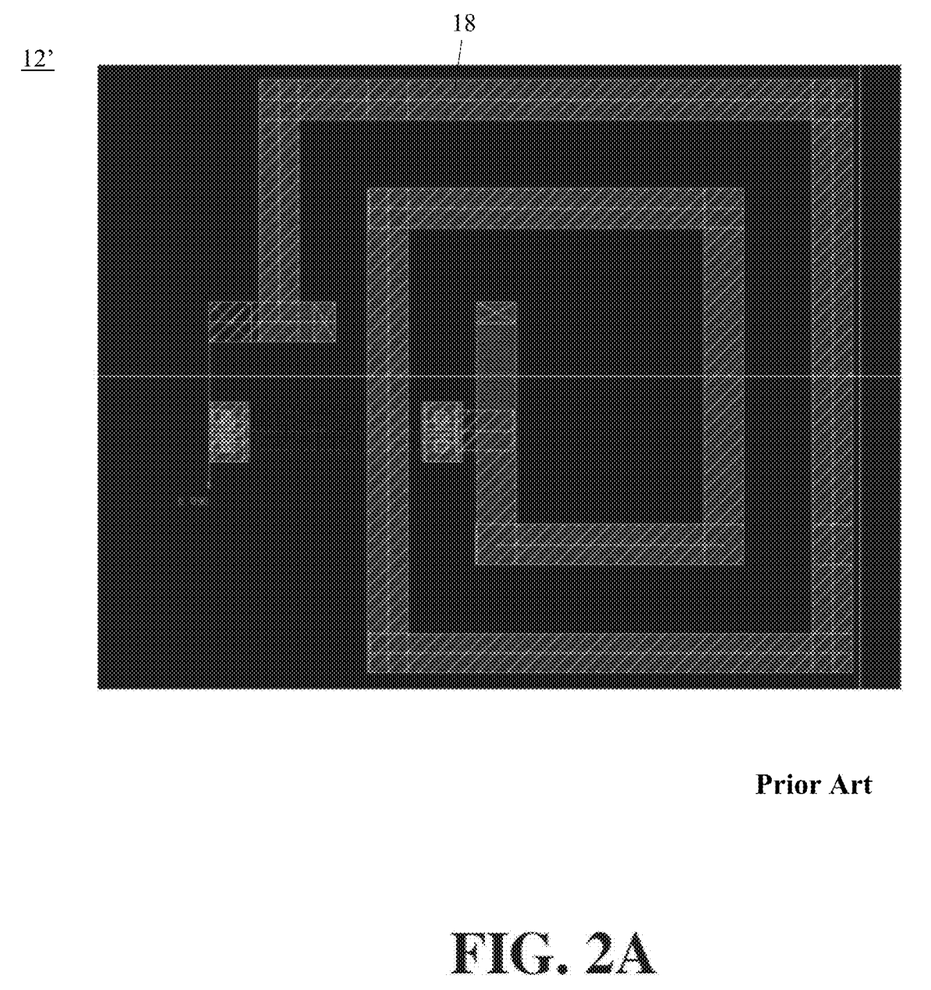
FIG. 2A is a physical layout of a prior art switchable spiral inductor with a single image loop directly underneath and electrically coupled to the main loop.
Figure 2B:
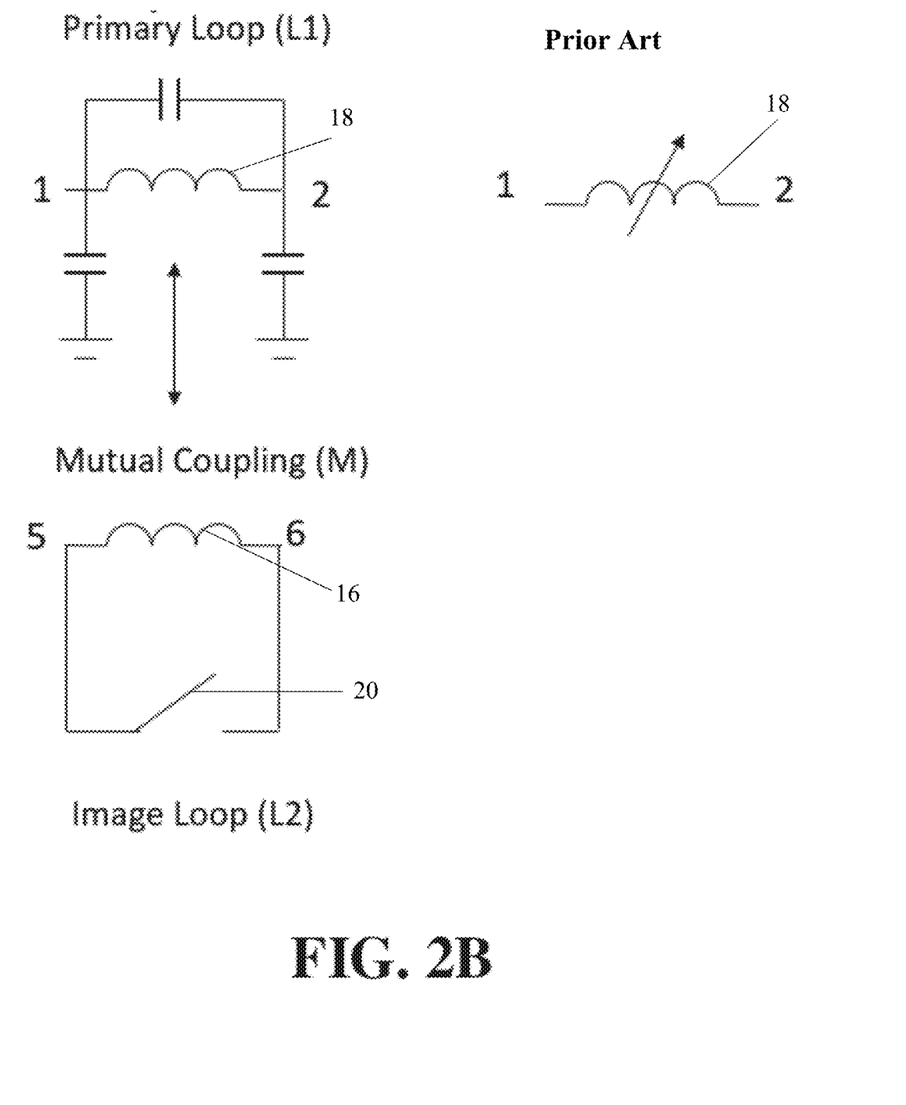
FIG. 2B illustrates circuit diagrams of the primary loop and the image loop of the switchable spiral inductor shown in FIG. 2A separated for illustration purposes.

For example, referring to FIGS. 2A and 2B, this can be achieved using a switchable spiral inductor 12' having an image loop inductor 16 proximate and located directly underneath the primary loop unit inductor 18. FIG. 2B illustrates separate circuit diagrams for the image loop inductor 16 and the primary loop unit inductor 18 of the switchable spiral inductor 12' for illustration purposes.

The image loop inductor 16 includes a switch 20 that may be open or closed. The primary loop unit inductor 16 can be varied between inductance values of L1 ($L_{open}$) when the switch 20 is open such that the image loop inductor 16 is open circuited and L1(1-k²) [$L_{closed}$] when the switch 20 is closed such that the image loop inductor 16 is closed (where k is the magnetic coupling coefficient between the primary and image loop). Using these techniques, wideband tunable delays can be achieved. However, the self-inductance of the primary loop unit inductor 18, even for a modest number of turns and short length, limits the use of the switchable LC sections at millimeter wave frequencies. In this structure, the inductance can be switched from $L_{open}$ to $L_{closed}$ as the switch 20 on the image loop inductor 16 is opened or closed. However, the parasitic capacitances in this approach, which are dictated by the design rules of the manufacturing process, typically degrade performance, and are not used in any productive way.

SUMMARY

A switched delay section for an integrated circuit device is disclosed. The switched delay section includes a segmented inductor loop comprising a plurality of segments separated by nodes. A plurality of capacitors are coupled between the segmented inductor loop to provide a plurality of delay sections. An image loop is in electrical communication with the segmented inductor loop. The image loop includes a switch configured to place the plurality of capacitors in one of a high capacitance or a low capacitance state to provide a variable delay value.

A method of making a switched delay section for an integrated circuit device includes providing a segmented inductor loop comprising a plurality of segments separated by nodes. A plurality of capacitors are located inside the segmented inductor loop to provide a plurality of delay sections. An image loop is provided in electrical communication with the segmented inductor loop. The image loop includes a switch configured to place the plurality of capacitors in one of a high capacitance or a low capacitance state to provide a variable delay value.

A cascaded switched delay section for an integrated circuit device is also disclosed. The cascaded switched delay section includes a plurality of switched delay sections arranged in a cascaded configuration. Each of the plurality of switched delay sections includes a segmented inductor loop comprising a plurality of segments separated by nodes. A plurality of capacitors are located inside the another segmented inductor loop to provide another plurality of delay sections. An image loop is in electrical communication with the segmented inductor loop. The image loop includes a switch configured to place the plurality of capacitors in one of a high capacitance or a low capacitance state to provide a variable delay value.

A method of providing a variable delay for an integrated circuit device includes providing a segmented inductor loop comprising a plurality of segments separated by nodes. A plurality of capacitors are located inside the segmented inductor loop to provide a plurality of delay sections. An image loop is provided in electrical communication with the segmented inductor loop, the image loop comprising a switch configured to place the plurality of capacitors in one of a high capacitance or a low capacitance state to provide a variable delay value for the switched delay section. The switch is operated to provide a variable delay for the switched delay section.

An LC delay section for an integrated circuit device that includes adjustable delay line segments that significantly improve the operating frequency and group delay characteristics of LC based artificial lines by segmenting the inductors is described. This approach offers advantages in die area, insertion loss, and wide band true time delay over switched transmission lines or other conventional approaches. A differential implementation with tunable six port delay cells is also disclosed, although any number of ports could be employed in the differential implantation disclosed. These delay elements have both inductive and capacitive tunability to change time delay while maintaining input and output impedance. The use of these delay elements in programmable delay lines or linear phase shifters with discrete or continuously variable delay is also disclosed Examples of the present technology provide adjustable delay line segments (LC sections) that significantly improve the operating frequency and group delay characteristics of LC based artificial lines by segmenting the inductors. This approach offers advantages in die area, insertion loss, and wide band true time delay over switched transmission lines or other conventional approaches.

Examples of the present technology also provide a fully differential tunable inductor that can be employed with the adjustable LC delay sections.

Examples of the present technology also provide a tunable segmented LC section with spiral coupled lines arranged to achieve a higher Q, more inductance, and delay in a fully differential delay line. Both the delay and impedance are tuned with switched tertiary coils and a shunt capacitor.

Examples of the present technology also provide switched sections using these elements to yield multi-bit delay (linear phase shift) tuning. The segmented spiral delay section is demonstrated in programmable delay lines with discrete and continuously variable delays.

DETAILED DESCRIPTION

Figure 3A:
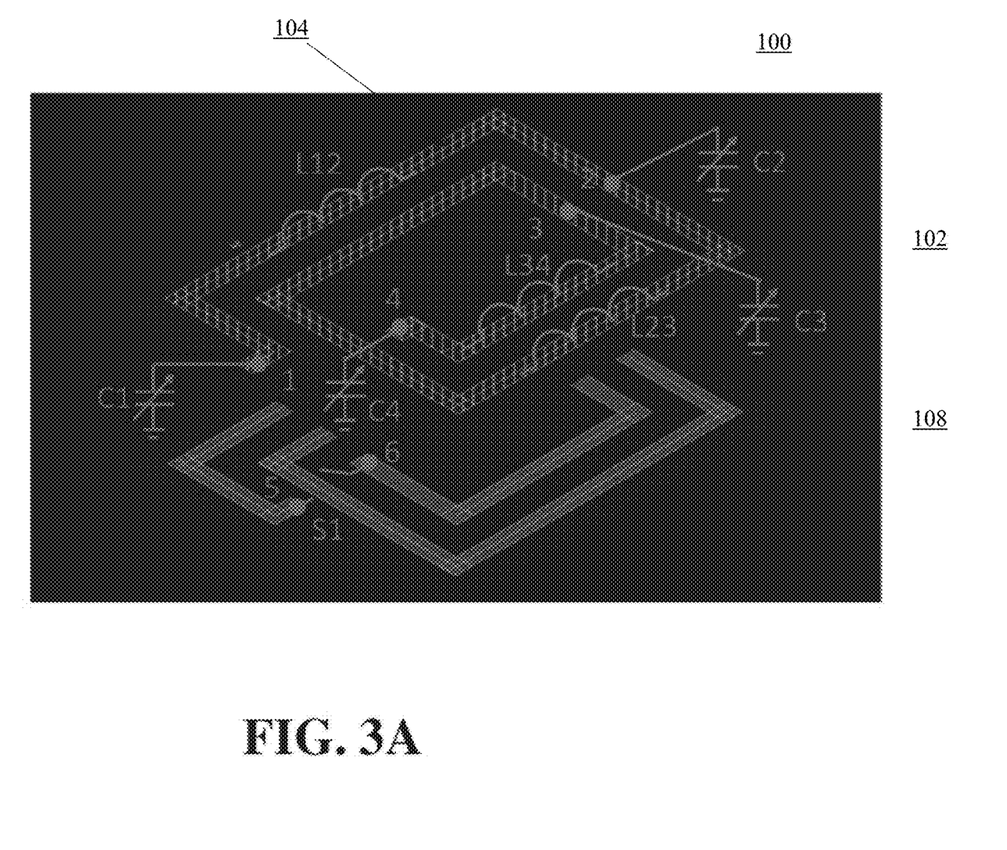
FIG. 3A is a perspective view of a physical layout of an exemplary segmented LC delay section for an integrated circuit device.
Figure 3B:
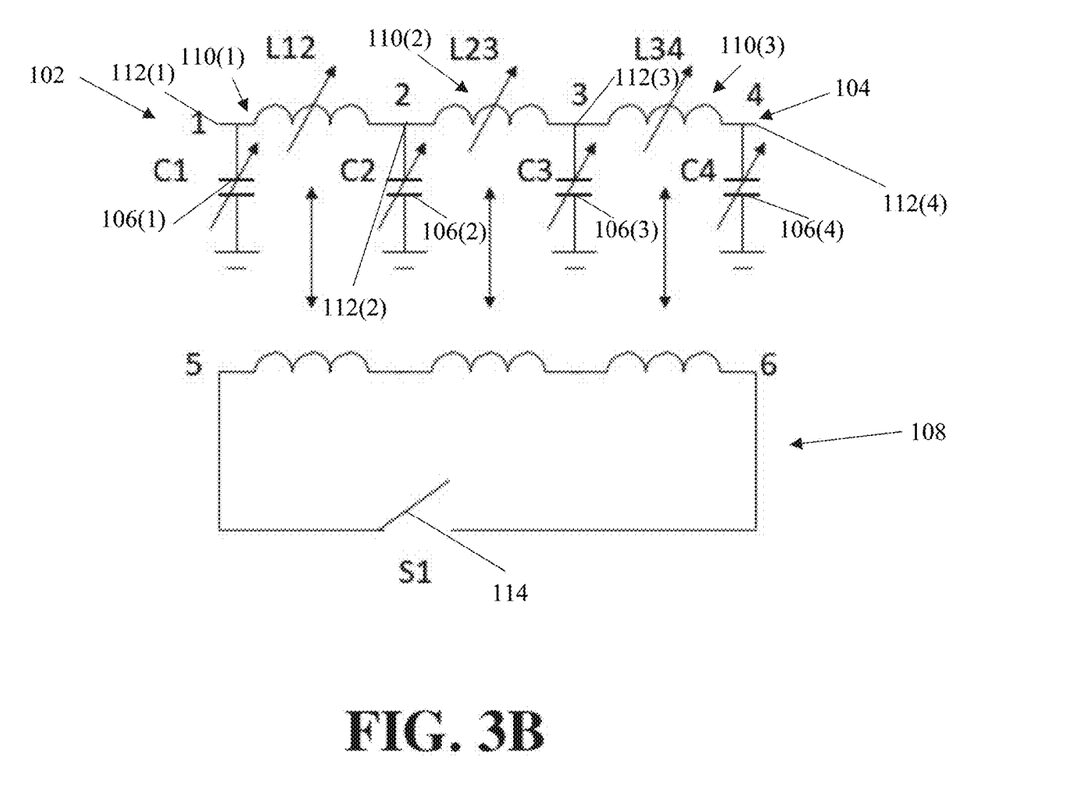
FIG. 3B is a circuit diagram of the exemplary segmented LC delay section shown in FIG. 3A with the primary loop and the image loop shown separately for illustration purposes.

An exemplary single ended, segmented, switched LC delay section 100 for an integrated circuit device is illustrated in FIGS. 3A-3B. The LC delay section 100 includes a primary loop 102 including a segmented spiral inductor 104 with switched capacitors 106(1)-106(4) inside the segmented spiral inductor 104 and an image loop 108, although the LC delay section 100 may include other type and/or numbers of other devices, components, and/or other elements in other configurations, such as the alternative configurations described below. The use of segmented spiral inductor 104 with the switched capacitors 106(1)-106(4) inside the segmented spiral inductor 104 provides a plurality of segmented LC sections 110(1)-110(3) (L12, L23, and L34) that advantageously provide an artificial delay section that functions more like an ideal transmission line. Further, the segmented LC sections 110(1)-110(3) provide for a more controllable delay. Further, this configuration allows for arbitrarily small unit delays in the plurality of LC sections and pushes the Bragg frequency of the LC delay section much higher. This allows for physically smaller delay sections (which saves area on the chip) and less overall loss per unit length (which improves bandwidth). The segmented switched LC sections 110(1)-110(3) may be employed in integrated circuit devices or modules for wideband programmable delays for any number of applications.

Figure 4:
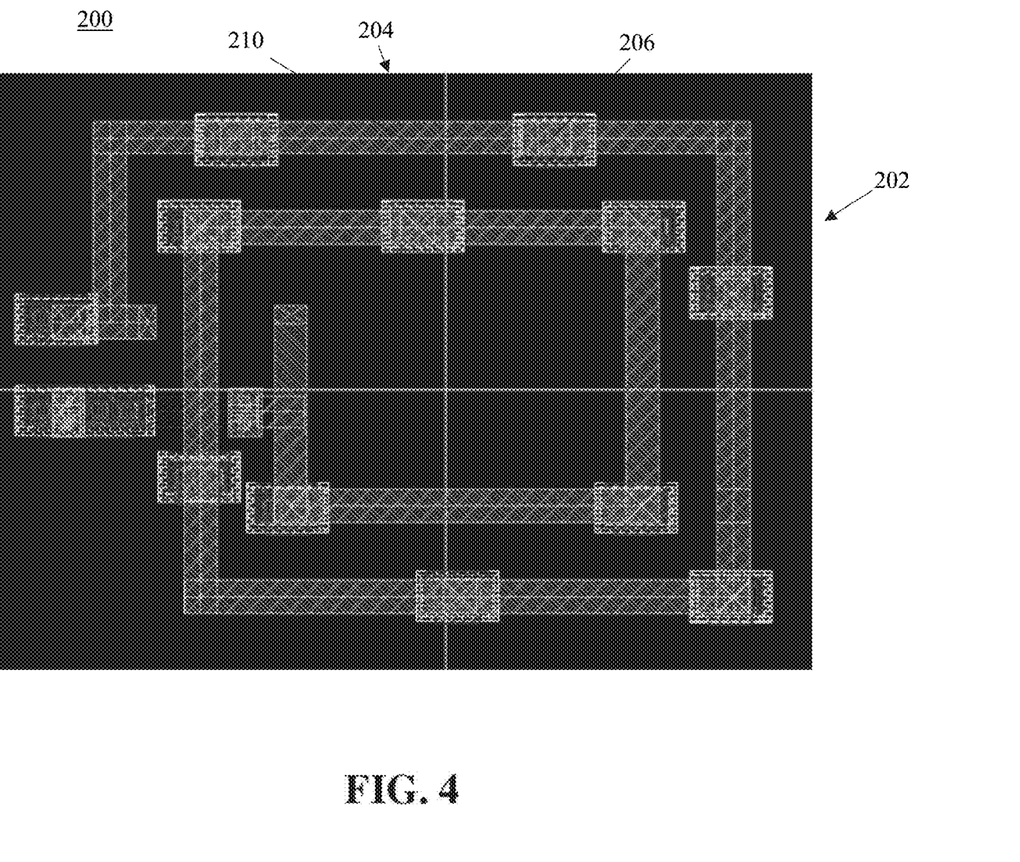
FIG. 4 is a top view of a physical layout of another exemplary segmented LC delay section for an integrated circuit device.

Referring again to FIGS. 3A and 3B, the primary loop 102 is provided as a top layer in the LC delay section 100 with the image loop 108 located physically underneath the primary loop 102. The primary loop 102 includes a single inductor loop formed by the segmented spiral inductor 104. The segmented spiral inductor 104 can be formed as a wire trace on a chip, for example. As shown in FIGS. 3A and 3B, the segmented spiral inductor 104 is segmented into the three segmented sections 110(1)-110(3) at nodes 1-4, although other numbers of segments can be employed. For example, FIG. 4 shows an exemplary LC delay section 200 with twelve segments 210 in the primary loop 202 as described below (while a single segment 210 is designated by numeral, it is to be understood that FIG. 4 illustrates additional segments). The additional segments allow for an increased cutoff frequency of the LC delay section 200. In this example, the operational frequency of the primary loop 202 is a factor of the number of segments employed.

Referring again to FIGS. 3A and 3B, the three segments 110(1)-110(3) provide unit inductances L12, L23, and L34, respectively. In this case, the unit inductances are equal such that: L12=L23=L34~Lprimary/3. As a result, the Bragg frequency $$\left(\frac{1}{\pi\sqrt{LC}}\right)$$

is increased by a factor of 3, without consuming more die area. In general, the Bragg frequency increases by the number of segments employed in the LC delay section.

Referring more specifically to FIG. 3B, the image loop 108 includes a switch 114 that allows the segmented inductor sections 110(1)-110(3) (L12, L23, L34, for example) to be switched between low and high inductance values by varying the mutual magnetic coupling between the primary loop 102 and the image loop 108. Switched capacitors 106(1)-106(4) (C1-C4) are located inside the segmented spiral inductor 104 at the nodes 112(1)-112(4). By way of example, the switched capacitors 106(1)-106(4) can be varactors (voltage controlled capacitors) that may be adjustable based on a control voltage. The high and low values of capacitors 106(1)-106(4) and segmented inductor sections 110(1)-110(3) (L12, L23, L34) are chosen to provide constant $Z_o$ according to Equation 4, while adjusting the phase velocity $V_{ph}$ according to Equation 3. In this configuration, the unit capacitance is distributed inside the spiral inductor 104. Distributing the shunt capacitance within segmented sections 110(1)-110(3) of the segmented spiral inductor 104 allows for the use of artificial transmission line approaches to create long delays and wideband linear phase shifts at millimeter wave frequencies.

In another example, the capacitors 106(1)-106(4) (C1-C4) can be continuously tuned between $C_{max}$ and $C_{min}$ to create continuously variable delays. In one example, the switch 114 of the image loop 108 is a PIN diode, although in other examples, the switch 114 in the image loop 108 can be implemented as a field effect transistor (FET) switch. In another example, the switch 114 may be replaced with a varactor to provide continuous tuning for the segmented inductor sections 110(1)-110(3) (L12, L23, L34).

An exemplary operation of the LC delay section 100 illustrated in FIGS. 3A-3B will now be described. The LC delay section 100 can be operated to provide an adjustable delay through the operation of the switch 114 on the image loop 108, which may be a PIN diode or a FET switch, and adjusting the capacitance (C1-C4) of the switched capacitors 106(1)-106(4) appropriately. The time delay ($t_d$), which is provided by the square root of the product of the inductance and capacitance, is adjusted by varying the inductance through operation of the switch 114 and the capacitance by adjusting the control voltage. The characteristic impedance ($Z_0$) is maintained at a constant value based on Equation 4 by keeping the ratio of inductance to capacitance the same.

In a high state, which provides a long delay, the switch 114 is opened which increases the inductance in the primary loop 102. Opening the switch 114 provides an increased inductance, while setting low reverse voltage bias on the capacitors 106(1)-106(4) increases the capacitance. In the high state (switch open), the inductance and capacitance are increased by the same factor to maintain the characteristic impedance ($Z_0$) of the LC delay section 100.

In a low state, which provides a short delay, the switch 114 is closed which decreases the inductance in the primary loop 102. Closing the switch 114 provides a decreased inductance, while a high reverse voltage bias on the capacitors 106(1)-106(4) decreases the capacitance. In the low state (switch 114 closed), the inductance and capacitance are decreased by the same factor to maintain the characteristic impedance ($Z_0$) of the LC delay section 100.

Referring now more specifically to FIG. 4, an exemplary physical layout of an LC delay section 200 having a primary loop 202 with a segmented spiral conductor 204 having twelve segments 210, by way of example only, is illustrated. The shunt capacitors 206 located inside the segmented spiral conductor 204 are implemented with varactors that are switched between low and high capacitance values using an image loop switch implemented with a PIN diode (not shown). The operation of the LC delay section 200 is the same as described above with respect to LC delay section 100.

Figure 5:
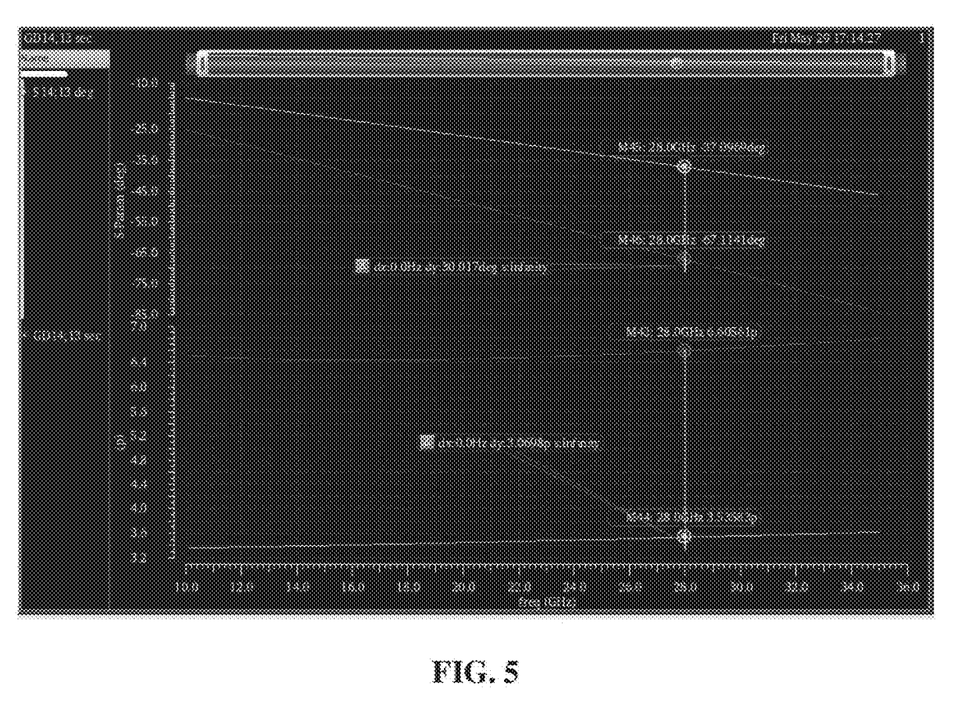
FIG. 5 is a graph of linear phase shift and group delay for the physical layout shown in FIG. 4.

FIG. 5 shows a graph of experimental data for phase across frequency (top) and delay across frequency (bottom) for the exemplary LC delay section 200 illustrated in FIG. 4. In one example, the circuit shown in FIG. 4 is configured to provide a broadband switchable group delay that switches between 3.5 ps and 6.6 ps from 10 GHz to 36 GHz and a narrowband linear phase shift across frequency as shown in FIG. 5. This example provides a broadband delay that may be employed, for example, in radar applications.

Figure 6:
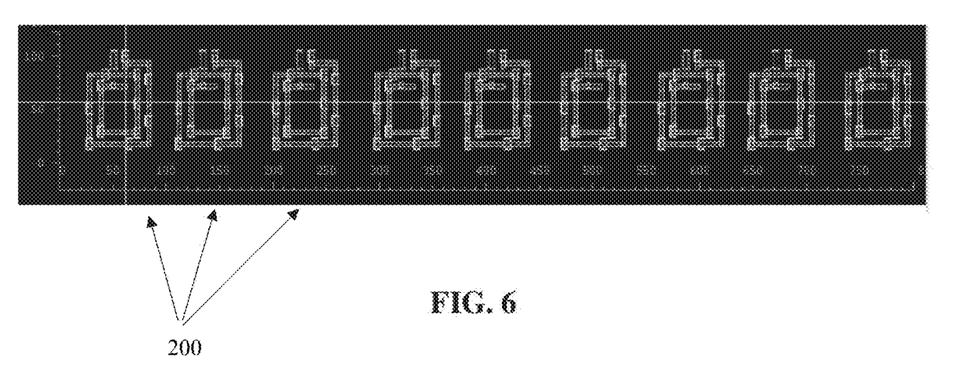
FIG. 6 is an exemplary implementation of cascaded LC delay sections.

In another example, as shown in FIG. 6, the segmented, switchable LC section 200 shown in FIG. 4, for example, can be cascaded to create longer switchable delays with significantly smaller die size than a switched transmission line segment, and without the bandwidth limitations of a non-segmented switched LC section. In this example, the layout includes a set of nine (6+3) LC sections 200 daisy chained together, although other configurations may be employed. The configuration in FIG. 6 provides 0, 90, 180, and 270 degree phase shifts. In one example, the cascade of segmented LC delay sections 200 are provided in a 100×800 μm die area, although other die areas may be employed.

Figure 7:
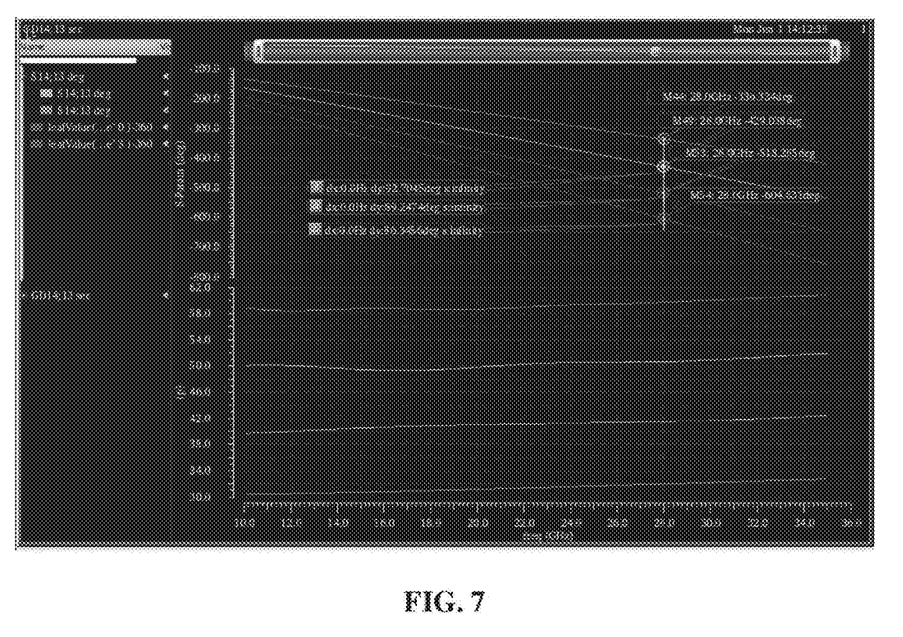
FIG. 7 is a graph of linear phase shift and group delay for the physical layout shown in FIG. 6.

FIG. 7 shows a graph of experimental data for phase across frequency (top) and delay across frequency (bottom) for the exemplary cascaded segmented LC delay sections 200 shown in FIG. 6. As shown in FIG. 7, the configuration of cascaded segmented LC sections 200 as shown in FIG. 6 provides linear phase shift and broadband, or wideband, programmable group delay from 10-36 GHz. The configuration of FIG. 6 provides four different delays at approximately 30 ps, 40 ps, 50 ps, and 59 ps, with phase shifts at 28 GHz in 90 degree steps (0, 90, 180, and 270). This configuration may be employed, for example, in beam steering applications that require broadband delays with electrically long phase shifts. Although exemplary layouts are illustrated and described, the present technology may be employed to provide any number of variable delays for various applications.

Figure 8A:
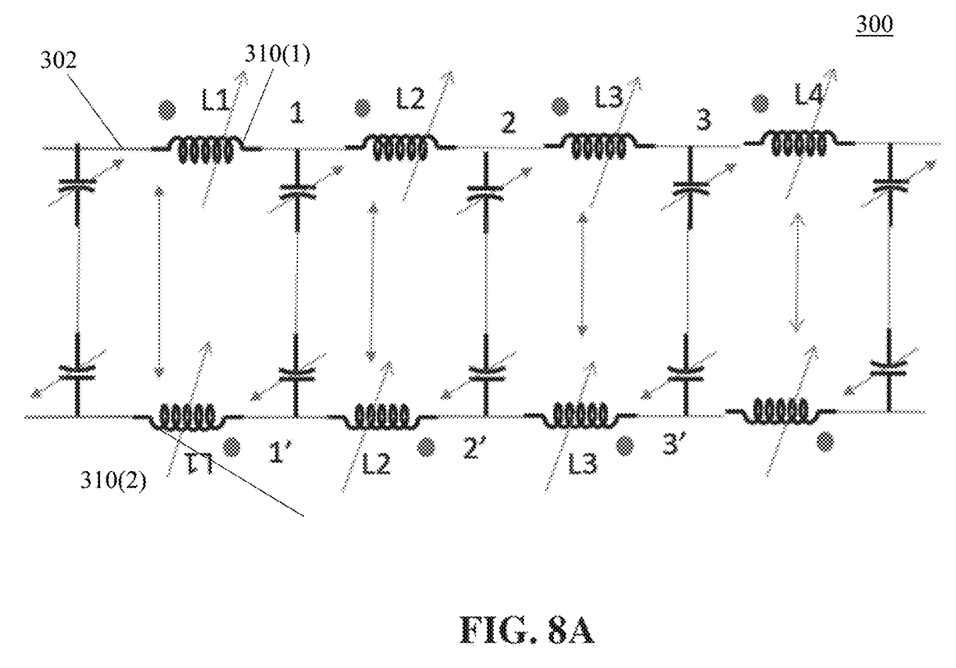
FIG. 8A is a circuit diagram of an example of a fully differential segmented switched LC delay section of the present technology.
Figure 8B:
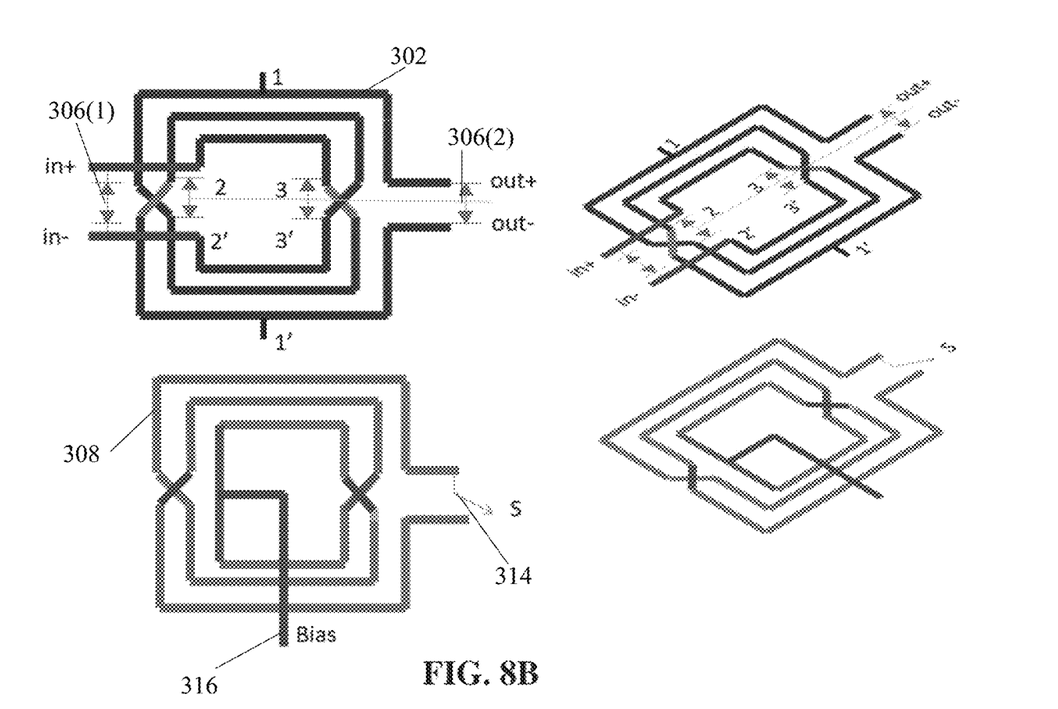
FIG. 8B is an exploded top view (left) and an exploded perspective view (right) of the elements of the fully differential segmented switched LC delay section shown in FIG. 8A.

Referring now to FIGS. 8A and 8B, in one example, the segmented switched LC delay sections described herein may be employed in a fully differential structure. The above examples of the segmented LC sections were single ended and need proper low-impedance grounding, which is difficult to achieve at millimeter wave frequencies and consumes space that could be used for many other purposes. In addition, poor grounding can cause unwanted reflections, group delay ripple, and bandwidth limitations. The requirement of low-impedance grounding can be obviated by the differential techniques described below. Additionally, the differential methods also save space by an increase in inductance per unit length and a decrease in unit capacitance for a given area. Since substrate related parasitic capacitance is reduced, these techniques can be employed to implement efficient drivers for differential delay lines.

Referring again to FIGS. 8A and 8B, a multi-level tunable 6 port 3-D differential inductor 300 with segmented LC sections is illustrated. In this example, the primary loop 302 or main inductor includes two coupled segmented spiral inductor coils 310(1) and 310(2) that are arranged in a planar fashion on the top metal as shown in the top portion of FIG. 8B, with a bottom metal underpass. In this example, the primary loop 302 inductor is a four terminal differential element with input capacitors 306(1) and output capacitors 306(2), such as varactors (shown in FIG. 8A). The input capacitors 306(1) and the output capacitors 306(2) are tunable to a high or low state. Both the inductance and capacitance are tuned to get delay tuning (with impedance matching).

The differential segmented inductors provide a higher effective inductance and higher Q, and are more compact than a single inductor in a transmission line application. The loading nodes for shunt capacitance are located in the segmented spiral inductors and are symmetric (along a line of symmetry) and even for both the coupled segmented inductors, and are noted by pairs 1-1', 2-2', and 3-3' in the top portion of FIG. 8B.

Each of the segmented inductors in this scheme benefits from the coupling, as one gets a boost in inductance from the other as a result of the coupling. Effectively, the inductance in each the segmented inductor sections is increased by the factor of its coupling with the adjacent line. This property of the differential inductance allows higher inductance per unit length, and also reduces the length needed and saves area.

A third coil (bottom portion of FIG. 8B) is arranged below the top metal and evenly coupled to the top metal to provide an image loop 308. A switch 314 is connected to the image loop 308 to effect a change in inductance (hence tuning) for the structure. The switch 314 can be a PIN diode or a FET switch. The structure also has capacitors 306(1) and 306(2), such as varactors, at the input and at the output, respectively, as described above, to set the impedance and vary the delay at the same time. By way of example, C1 and C2 may be varactors. The switched and coupled coil of the image loop 308 affects the main 4 port inductor in a very symmetric and even fashion such that both the coupled, segmented sections 310(1)-310(4) of the main inductor primary loop 302 are evenly tuned by the third coil or image loop 308. The switch 314 is shown connected to the third coil inductor or image loop 308 (bottom of FIG. 8B) and can short or open it. The third inductor coil or image loop 308 also includes a bias (tap) 316 that is used to bias the switch 314.

An exemplary operation of the fully differential segmented switched LC delay section 300 shown in FIGS. 8A and 8B will now be described. When the switch 314 is in an open state, the delay is in high state ($t_d\_high$) as a result of the increased capacitance and low reverse voltage bias on the capacitors 306(1) and 306(2). When the switch 314 is closed, the effective inductance of the delay path is reduced such that the delay is in a low state ($t_d\_low$). The input and output capacitors 306(1) and 306(2) are switched to maintain the characteristic impedance.

The segmented tunable approach shown in FIGS. 8A and 8B retains the space savings (compactness) of an artificial LC delay line and solves the delay flatness. Wideband flat delay response is created by this circuit, while compactness is retained. This differential arrangement of a segmented LC section makes for elegant cascading of the structure and results in a compact practical implementation with no sensitivity to RF grounding.

Figure 9:
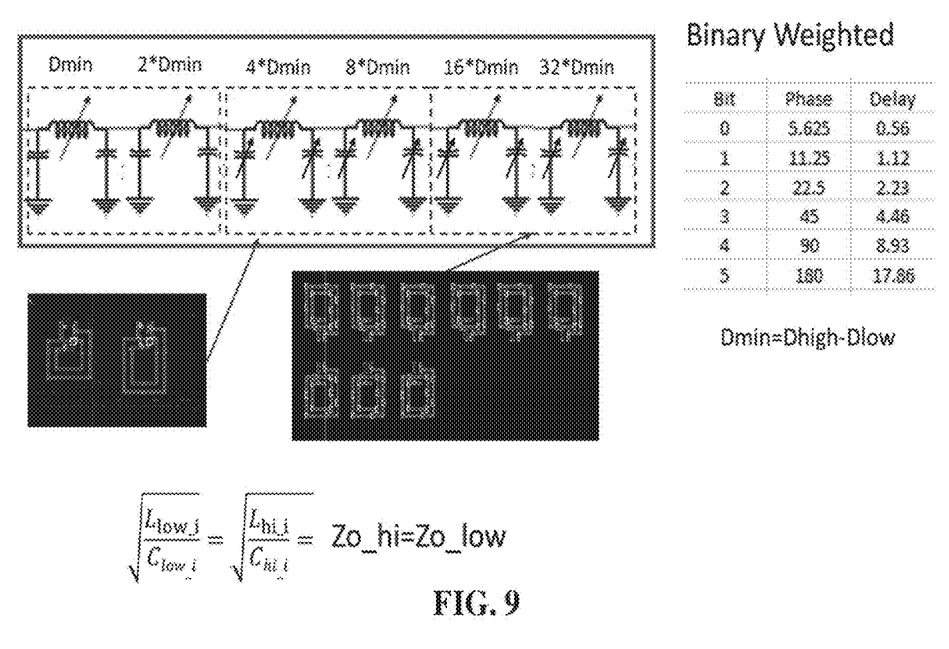
FIG. 9 illustrates a programmable delay line with an arbitrary set of binary weighted discrete delays constructed of segmented LC sections.

Referring now to FIG. 9, in one example programmable delay lines can be constructed from the switched segmented LC sections disclosed herein. The programmable delay lines can provide a discrete set of delay values in binary weighted or thermometer coded forms. FIG. 9 illustrates a programmable delay line with an arbitrary set of discrete delays constructed of segmented LC sections.

The segmented LC sections are configured to provide wideband programmable delay in single ended (FIGS. 3A, 3B, 4, and 6) or fully differential form factors (FIGS. 8A and 8B). This enables switchable delays and linear phase shifters that provide a multi octave bandwidth. FIG. 9 illustrates a wideband switchable delay that includes an array of N cascaded segmented sections i=1, 2, . . . N. In this configuration, any given section in the array of cascaded sections can be switched to a high or low delay state as described above. As long as the characteristic impedance in the high and low delay states are equal for all sections, a programmable delay of arbitrary discrete values [td_hi_i,td_lo_i] can be generated by the N cascading sections. For example, if N=6, as shown in FIG. 9, and the sections are delays that are binary weighted, a 6 bit programmable delay can be implemented. Unit delays can also be thermometer coded or take on arbitrary selection of discrete values.

Figure 10:
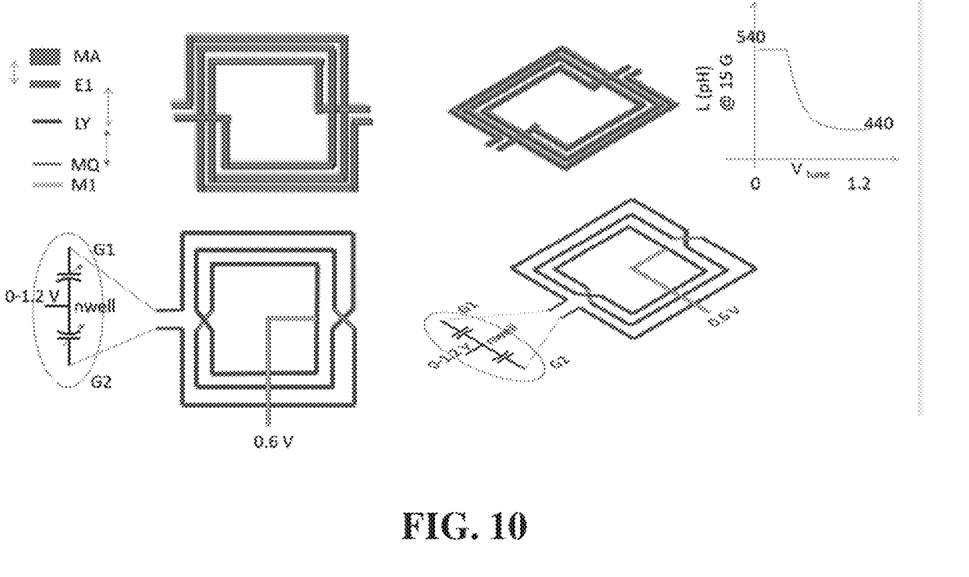
FIG. 10 illustrates a continuously adjustable delay line constructed from segmented LC sections.

FIG. 10 illustrates a continuously adjustable delay line constructed from segmented LC sections with continuous delay tuning. The shunt capacitors are varactors and can be continuously tuned between Cmax and Cmin making it possible to create continuously variable delays. By replacing the pin diode switch with a varactor it is also possible to have continuous tuning of the unit inductor.

The tunable nature of the differential inductor disclosed earlier can be analog as well. Instead of a FET or pin switch (S), we can have a MOS varactor whose capacitance can be varied from Cmax-Cmin. The effective differential inductance in earlier embodiment can be continuously tuned at a given frequency. We show this with an example.

Figure 11:
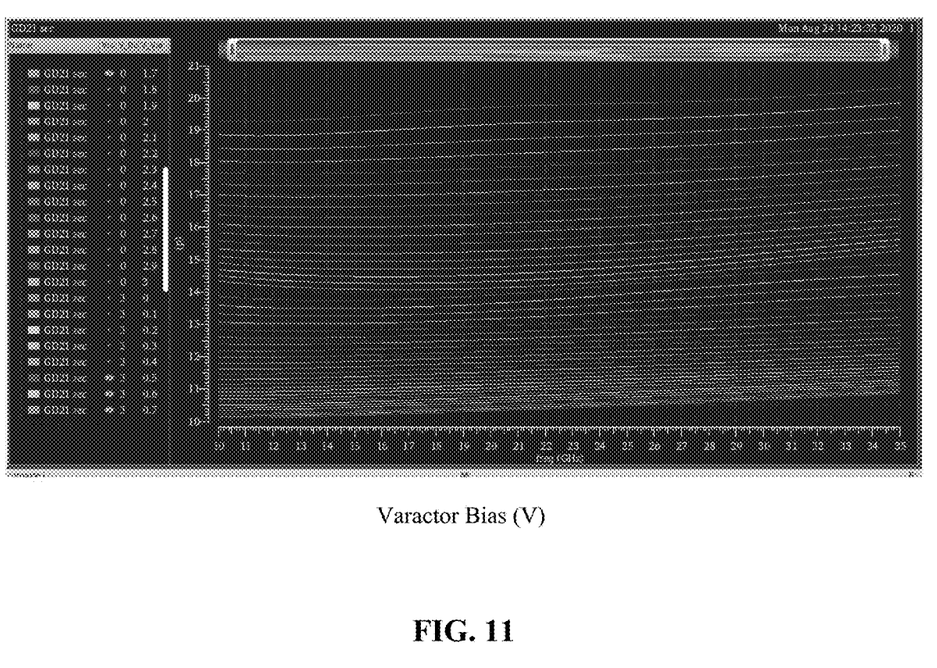
FIG. 11 illustrates experimental data related to continuously tuned delay over a 2:1 tuning range the exemplary segmented delay line of FIG. 10.

A positive voltage is applied to the center-tap of the bottom inductor. This biases the anode of the differential varactor with 0.6 V. A continuously varying tuning voltage is applied to the two cathodes tied together at a common-node. Effectively the reverse bias of the varactor can be changed in fine steps. This results in change of inductance continuously. With varactor tuning applied to the input and output of the differential top inductor, the input can be simultaneously matched and the delay tuned over a 2:1 range as shown in FIG. 11.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A switched delay section for an integrated circuit device comprising:
   a segmented inductor loop comprising a plurality of segments separated by nodes;
   a plurality of capacitors coupled between the segmented inductor loop to provide a plurality of delay sections; and
   a separate image loop in electrical communication with but not physically connected to the segmented inductor loop, the image loop comprising a switch in series with the image loop and configured to switch the plurality of segments between low and high inductance values by varying a mutual magnetic coupling between the segmented inductor loop and the image loop, wherein the plurality of capacitors are configured to be placed in one of a high capacitance or a low capacitance state to provide a variable delay value.

2. The switched delay section of claim 1, wherein the segmented inductor loop comprises a segmented spiral inductor.

3. The switched delay section of claim 1, wherein an operational frequency of the segmented inductor loop is based on a number of the plurality of segments in the segmented inductor loop.

4. The switched delay section of claim 1, wherein an operation frequency of the integrated circuit device is between about 10 GHz and about 36 GHz.

5. The switched delay section of claim 1, wherein the segmented inductor loop comprises at least three or more segments.

6. The switched delay section of claim 5, wherein the segmented inductor loop comprises at least twelve or more segments.

7. The switched delay section of claim 1, wherein the plurality of capacitors are varactors.

8. The switched delay section of claim 1, wherein the plurality of capacitors are coupled between the segmented inductor loop to distribute a unit capacitance among the plurality of segments of the segmented inductor loop.

9. The switched delay section of claim 1, wherein the switch is a PIN diode or a FET switch or a MEMS device.

10. The switched delay section of claim 1, wherein the variable delay value for the switched delay section is switchable between about 3.5 ps and about 6.6 ps.

11. The switched delay section of claim 1, wherein one or more of the plurality of capacitors comprise a varactor configured to provide the variable delay value as a continuously adjustable delay.

12. The switched delay section of claim 1, wherein a characteristic impedance of the segmented inductor loop is constant between the high capacitance and the low capacitance state.

13. The switched delay section of claim 1, wherein the segmented inductor loop is a differential tunable inductor.

14. A method of making a switched delay section for an integrated circuit device comprising:
   providing a segmented inductor loop comprising a plurality of segments separated by nodes;
   locating a plurality of capacitors inside the segmented inductor loop to provide a plurality of delay sections; and
   providing a separate image loop in electrical communication with but not physically connected to the segmented inductor loop, the image loop comprising a switch in series with the image loop and configured to switch the plurality of segments between low and high inductance values by varying a mutual magnetic coupling between the segmented inductor loop and the image loop.

15. The method of claim 14, wherein the segmented inductor loop comprises a segmented spiral inductor.

16. The method of claim 14, wherein an operational frequency of the segmented inductor loop is based on a number of the plurality of segments in the segmented inductor loop.

17. The method of claim 16, wherein the operation frequency is between about 10 GHz and about 36 GHz.

18. The method of claim 14, wherein the segmented inductor loop comprises at least three or more segments.

19. The method of claim 18, wherein the segmented inductor loop comprises at least twelve or more segments.

20. The method of claim 14, wherein the plurality of capacitors are varactors.

21. The method of claim 14, wherein the plurality of capacitors coupled between the segmented inductor loop to distribute a unit capacitance among the plurality of segments of the segmented inductor loop.

22. The method of claim 14, wherein the switch is a PIN diode or a FET switch or a MEMS device.

23. The method of claim 14, wherein a variable delay value for the switched delay section is switchable between about 3.5 ps and about 6.6 ps.

24. The method of claim 14, wherein the one or more of the plurality of capacitors comprise a varactor configured to provide a variable delay value as a continuously adjustable delay.

25. The method of claim 14, wherein a characteristic impedance of the segmented inductor loop is constant between a high capacitance and a low capacitance state.

26. The method of claim 14, wherein the segmented inductor loop is a differential tunable inductor.

27. A cascaded switched delay section for an integrated circuit device comprising:

a plurality of switched delay sections arranged in a cascaded configuration, each of the plurality of switched delay sections comprising:
a segmented inductor loop comprising a plurality of segments separated by nodes;
a plurality of capacitors located inside another segmented inductor loop to provide another plurality of delay sections; and
a separate image loop in electrical communication with but not physically connected to the segmented inductor loop, the image loop comprising a switch in series with the image loop and and configured to switch the plurality of segments between low and high inductance values by varying a mutual magnetic coupling between the segmented inductor loop and the image loop.

28. The cascaded switched delay section of claim 27, wherein the segmented inductor loop is a differential tunable inductor.

29. A method of providing a variable delay for an integrated circuit device, the method comprising:
providing a segmented inductor loop comprising a plurality of segments separated by nodes;
locating a plurality of capacitors inside the segmented inductor loop to provide a plurality of delay sections;
providing a separate image loop in electrical communication with but not physically connected to the segmented inductor loop, the image loop comprising a switch in series with the image loop and configured to switch the plurality of segments between low and high inductance values by varying a mutual magnetic coupling between the segmented inductor loop and the image loop; and
operating the switch to provide a variable delay for the plurality of delay sections.

* * * * *